(12) United States Patent
Cave et al.

(10) Patent No.: US 7,109,051 B2
(45) Date of Patent: Sep. 19, 2006

(54) METHOD OF INTEGRATING OPTICAL DEVICES AND ELECTRONIC DEVICES ON AN INTEGRATED CIRCUIT

(75) Inventors: Nigel G. Cave, Austin, TX (US); Omar Zia, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 43 days.

(21) Appl. No.: 10/989,940

(22) Filed: Nov. 15, 2004

(65) Prior Publication Data

US 2006/0105479 A1 May 18, 2006

(51) Int. Cl.
*H01L 21/00* (2006.01)
*H01L 21/338* (2006.01)

(52) U.S. Cl. .......................................... 438/29; 438/59
(58) Field of Classification Search ...................... None
See application file for complete search history.

(56) References Cited

U.S. PATENT DOCUMENTS

| | | | | |
|---|---|---|---|---|
| 3,569,997 | A * | 3/1971 | Lehovec | 250/552 |
| 5,612,231 | A * | 3/1997 | Holm et al. | 438/23 |
| 5,674,778 | A * | 10/1997 | Lee et al. | 438/24 |
| 5,885,847 | A * | 3/1999 | Yoon et al. | 438/59 |
| 5,937,274 | A * | 8/1999 | Kondow et al. | 438/47 |
| 5,963,788 | A * | 10/1999 | Barron et al. | 438/48 |
| 6,096,591 | A * | 8/2000 | Gardner et al. | 438/238 |
| 6,458,614 | B1 * | 10/2002 | Nanishi et al. | 438/31 |
| 6,585,424 | B1 * | 7/2003 | Chason et al. | 385/88 |
| 6,608,945 | B1 | 8/2003 | Deliwala | |
| 6,654,511 | B1 | 11/2003 | Deliwala | |
| 6,687,446 | B1 | 2/2004 | Arakawa | |
| 6,746,948 | B1 * | 6/2004 | Ueda et al. | 438/604 |
| 6,968,110 | B1 * | 11/2005 | Patel et al. | 385/131 |
| 2002/0164122 | A1 | 11/2002 | Taylor, Jr. | |
| 2003/0063885 | A1 | 4/2003 | Gunn, III | |
| 2003/0235370 | A1 | 12/2003 | Taillaert | |
| 2004/0002177 | A1 * | 1/2004 | Lin et al. | 438/48 |
| 2005/0054131 | A1 * | 3/2005 | Wada et al. | 438/31 |
| 2005/0214989 | A1 * | 9/2005 | Keyser | 438/155 |

(Continued)

FOREIGN PATENT DOCUMENTS

WO  PCT WO02/14915 A2  2/2002

(Continued)

OTHER PUBLICATIONS

Fischer et al., "0.1 dB/cm Waveguide Losses in Single-Mode SOI Rib Waveguides," IEEE Photonics Technology Letters, vol. 8, No. 5, May 1996, pp. 647-648.

*Primary Examiner*—Matthew Smith
*Assistant Examiner*—David Goodwin
(74) *Attorney, Agent, or Firm*—Michael J. Balconi-Lami

(57) ABSTRACT

A method for integrating an optical device and an electronic device on a semiconductor substrate comprises forming openings within an active semiconductor layer in a first region of the semiconductor substrate, wherein the first region corresponds to an electronic device portion and the second region corresponds to an optical device portion. A semiconductor layer is epitaxially grown overlying an exposed active semiconductor layer in the second region, the epitaxially grown semiconductor layer corresponding to an optical device region. At least a portion of an electronic device is formed on the active semiconductor layer within the electronic device portion of the semiconductor substrate. The method further includes forming openings within the epitaxially grown semiconductor layer of the optical device portion of the semiconductor substrate, wherein the openings define one or more features of an optical device.

37 Claims, 9 Drawing Sheets

U.S. PATENT DOCUMENTS

2005/0260802 A1* 11/2005 Pizzarulli .................... 438/152

FOREIGN PATENT DOCUMENTS

WO   PCT WO03/023469 A1   2/2003
WO   PCT WO03/023476 A1   3/2003

* cited by examiner

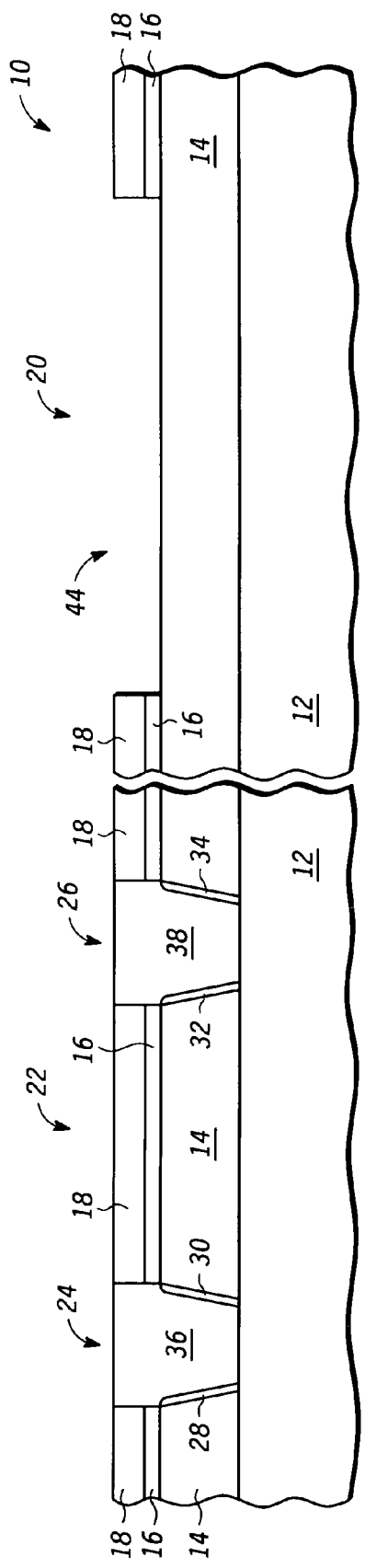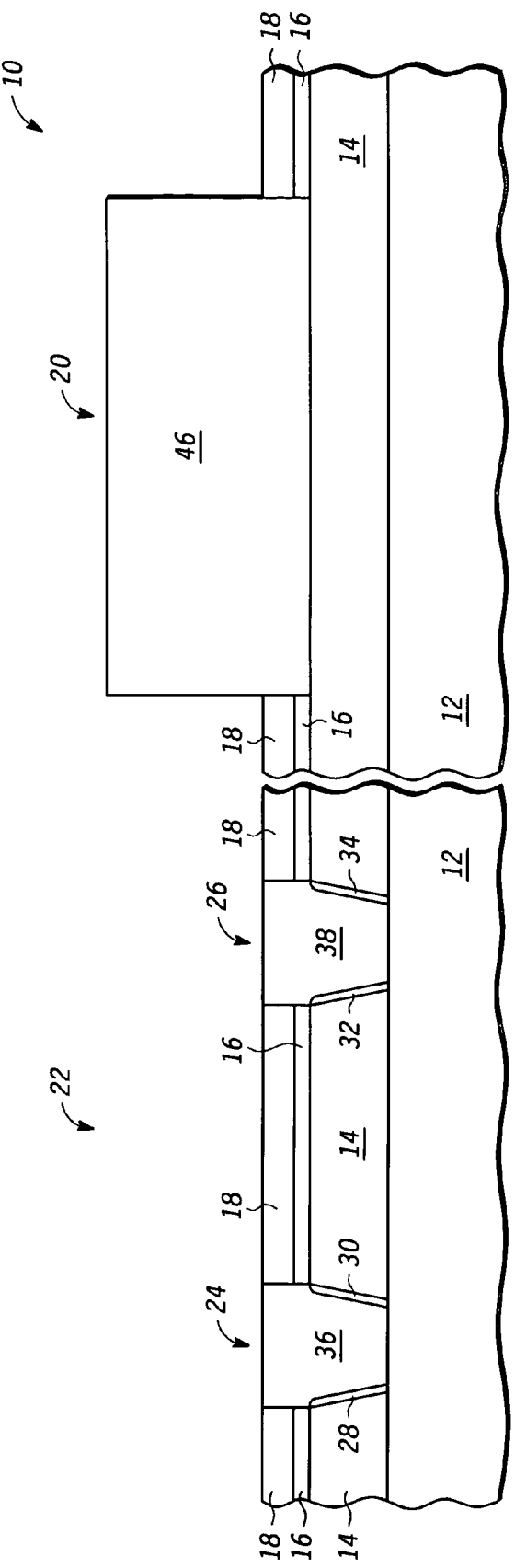

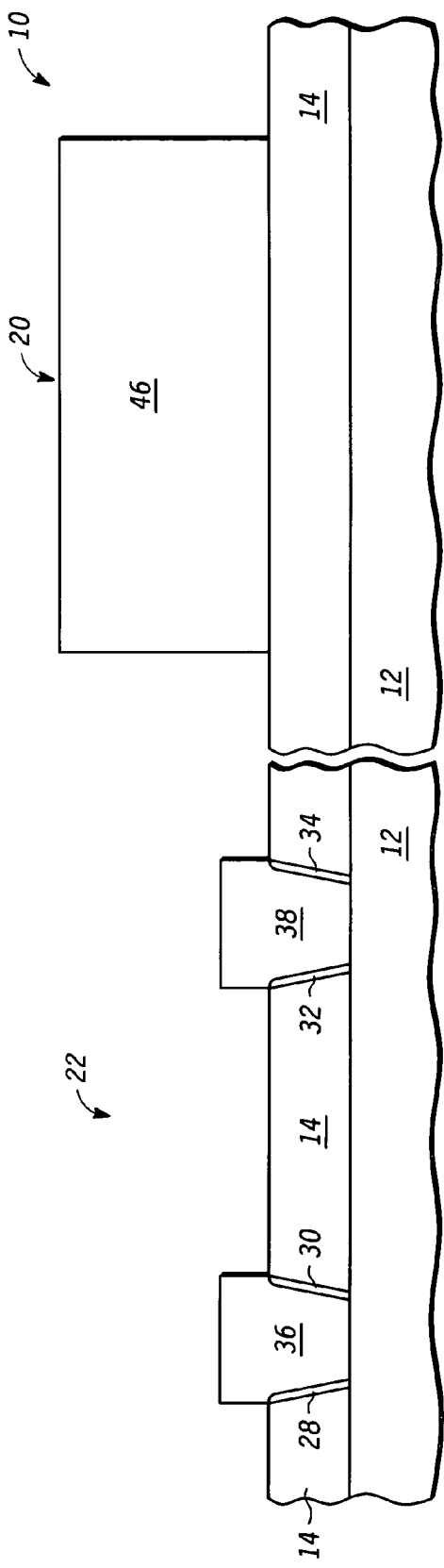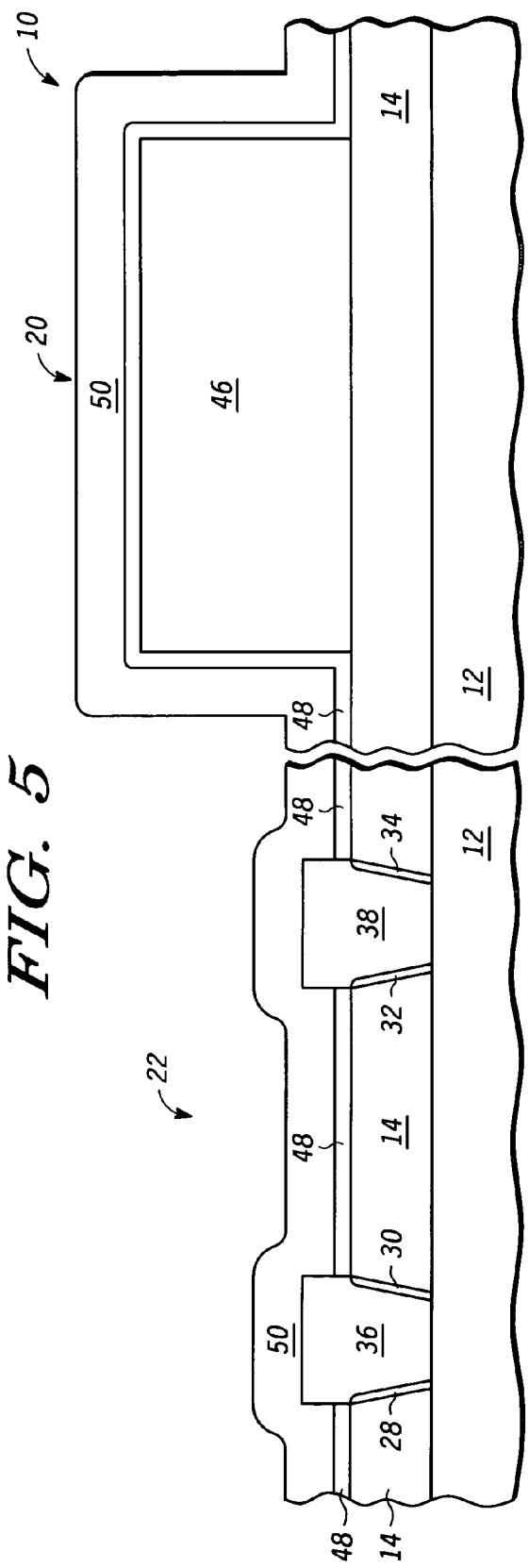
FIG. 5
FIG. 6

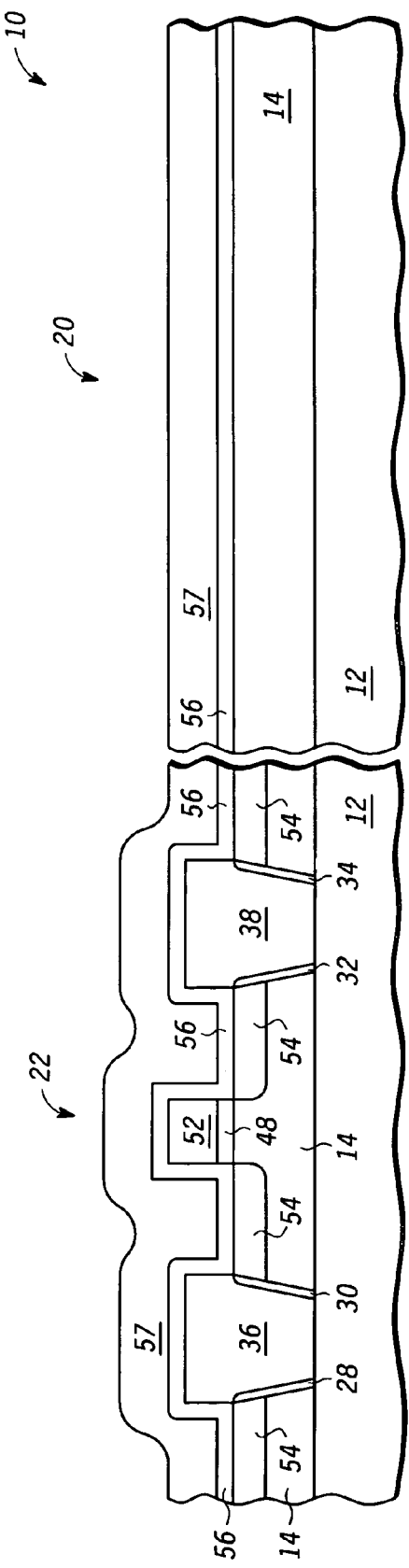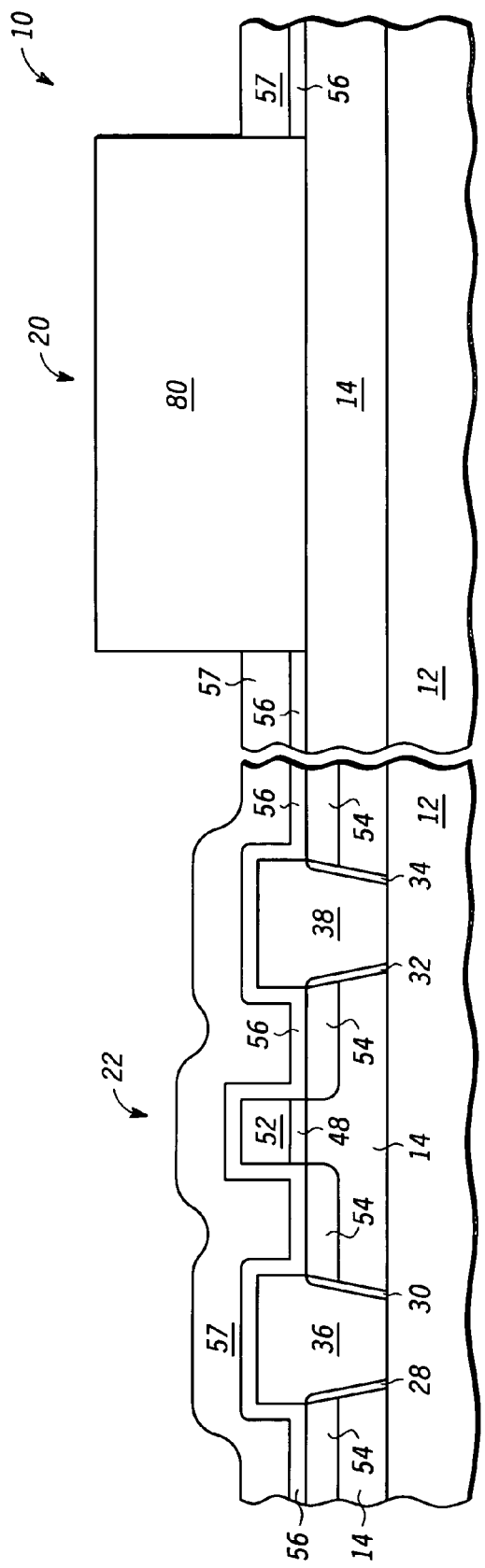

METHOD OF INTEGRATING OPTICAL DEVICES AND ELECTRONIC DEVICES ON AN INTEGRATED CIRCUIT

BACKGROUND

The present invention relates to providing different devices types on the same integrated circuits, and more particularly to integrating optical devices with electronic devices on the same integrated circuit.

As semiconductor processes and lithography continue to improve, transistor switching speeds continue to improve, which results in higher performance circuit functions. The circuits provide their outputs to other circuits. Often buses that are relatively long carry these signals. These buses inherently have capacitance and resistance so that an RC delay is present for an electrical signal being carried by the bus. The buses can be made bigger to reduce the resistance but that can also increase capacitance. Also there can be a great number of buses so that increasing bus size can cause the size of the integrated circuit to increase as well. The net effect is that the carrier of the signal is often a major speed limitation. Additional increases in transistor switching speed can result in relatively small increases in overall speed of operation.

One difficulty has been finding a practical way to take advantage of optical interconnects for signal transmission on an integrated circuit. One major issue is routing the optical signal in a manner that is manufacturable and consistent with transistor manufacturing considerations. The considerations are different for the two and either one or the other can become marginally functional or prohibitively expensive.

Thus, there is a need for a method for providing an improvement in integrating optical devices with electronic devices on the same integrated circuit.

SUMMARY

A method for integrating an optical device and an electronic device on a semiconductor substrate comprises forming openings within an active semiconductor layer in a first region of the semiconductor substrate, wherein the first region corresponds to an electronic device portion and the second region corresponds to an optical device portion. A semiconductor layer is epitaxially grown overlying an exposed active semiconductor layer in the second region, the epitaxially grown semiconductor layer corresponding to an optical device region. At least a portion of an electronic device is formed on the active semiconductor layer within the electronic device portion of the semiconductor substrate. The method further includes forming openings within the epitaxially grown semiconductor layer of the optical device portion of the semiconductor substrate, wherein the openings define one or more features of an optical device; forming a salicide blocking layer overlying the optical device portion, and saliciding the electronic device portion, wherein the salicide blocking layer prevents salicidation of the epitaxially grown semiconductor layer within the optical device portion; and forming an interlevel dielectric layer overlying the electronic device portion and the optical device portion of the semiconductor substrate.

BRIEF DESCRIPTION OF THE DRAWINGS

The present invention is illustrated by way of example and not limited by the accompanying figures, in which like references indicate similar elements, and in which:

FIG. 3 is a cross section of the semiconductor device structure of FIG. 2 at a subsequent stage in processing;

FIG. 4 is a cross section of the semiconductor device structure of FIG. 3 at a subsequent stage in processing;

FIG. 5 is a cross section of the semiconductor device structure of FIG. 4 at a subsequent stage in processing;

FIG. 6 is a cross section of a semiconductor device structure of FIG. 5 at a subsequent stage in processing;

FIG. 14 is a cross section of a semiconductor device useful in understanding a method according to a second embodiment of the invention at a stage in processing;

FIG. 15 is a cross section of the semiconductor device structure of FIG. 14 at a subsequent stage in processing.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

In one aspect, a semiconductor device structure has both a waveguide and a transistor on the same integrated circuit. The starting material thickness requirements for high performance electronics and Optical Structures formed on SOI can be different. In the case where both high-performance electronics and high performance Optics are desired on a single wafer, an epitaxial silicon growth may be required to optimize the thickness of one or both parts of the integrated circuit. Using a starting SOI substrate, selected for compatibility with high-performance SOI, wherein the active semiconductor thickness may be on the order of 700 angstroms or less, trench isolation is used to form the electrical isolation of the transistors. In one embodiment, after completion of the electronics device trench isolation, an epitaxial silicon growth is performed in the optical regions of the circuit, wherein a thicker silicon layer may be desired for the formation of high performance waveguides within the region. Such an embodiment has the advantage that the waveguide region formation with its associated high temperatures is completed prior the majority of the transistor fabrication.

In another embodiment, epitaxial formation is performed after Source/Drain extension formation to maintain wafer planarity during the electronics device fabrication. In either embodiment, silicon removal is used for defining the optical devices in the optics region. Such devices could include, but not be limited to: a waveguide, an optical grating coupler, an optical modulator, an optical wavelength-selective filter or an arrayed waveguide grating. A salicide block is used over the optical devices to prevent salicide formation in unwanted areas of the waveguide.

Figure 1:
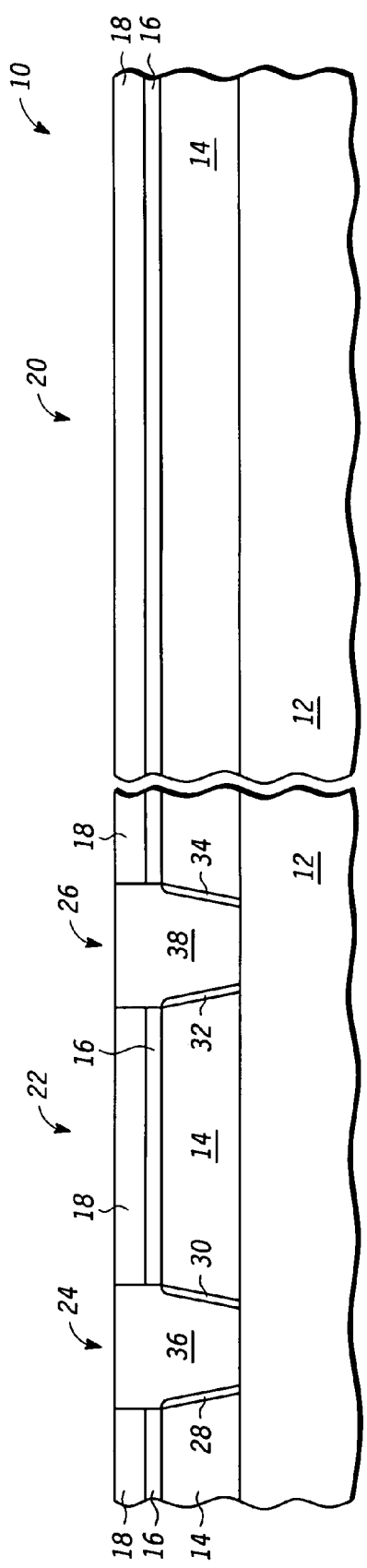
FIG. 1 is a cross section of a semiconductor device structure useful in understanding a method according to a first embodiment of the invention at a stage in processing.

Shown in FIG. 1 is a semiconductor device structure 10 comprising an insulating layer 12, a semiconductor layer 14 on insulating layer 12, a pad oxide layer 16 on semiconductor layer 14, and a nitride layer 18. Semiconductor device structure 10 is divided into an optical device region 20 and an electronic device region 22. In this example, optical device region 20 is for forming a waveguide and electronic device region 22 is for forming a transistor. Optical device region 20 has an opening 24 and an opening 26. Openings 24 and 26 extend to insulating layer 12. Semiconductor layer 14 is preferably monocrystalline silicon that is on the order of about 700 Angstroms thick. In one embodiment, insulating layer 12 includes oxide of on the order of about 8000 Angstroms or greater in thickness on a relatively thick silicon substrate (not shown). The exact thickness is determined by the particular optical device requirements. Insulating layer 12 and semiconductor layer 14 together in this described manner are similar to a standard semiconductor on insulator (SOI) wafer except that in this case insulating layer 12 is thicker than the corresponding buried oxide layer in a conventional SOI wafer. During the formation of openings 24 and 26, optical region 20 is masked so that no openings are formed in optical region 20. Openings such as openings 24 and 26 are often called trenches. Pad oxide 16 and nitride 18 are conventional layers used in preparation for trench formation. After formation of liners 28, 30, 32 and 34 in opening 24 and opening 26, a conventional trench fill is performed, preferably with high density plasma (HDP) oxide as shown in regions 36 and 38. CMP is performed to complete a conventional shallow trench isolation (STI) process module.

Figure 2:
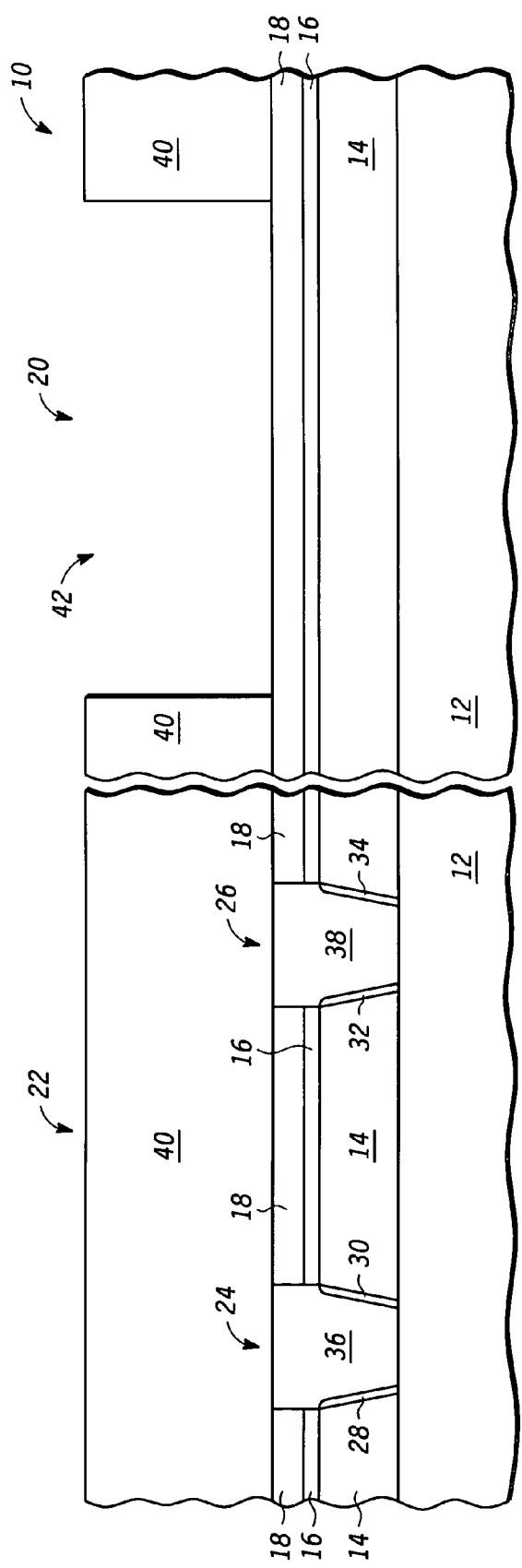
FIG. 2 is a cross section of the semiconductor device structure of FIG. 1 at a subsequent stage in processing.

Shown in FIG. 2, a layer of photoresist 40 is deposited and patterned using photolithography on the wafer, thus creating an opening 42 over optics region 20. The photoresist could include a single spin-on resist or a stack of an anti-reflection coating and photoresist.

Shown in FIG. 3, a portion of pad oxide 16 and nitride 18 are removed with a etching step in region 42 to form an opening 44 in optical device region 20. The photoresist 40 is subsequently removed.

Shown in FIG. 4, silicon is selectively epitaxially grown in open region 44, using film stack 18,16 as the selective growth window. The epitaxial growth is intended to thicken the silicon layer to a total of approximately 3000 angstroms. The actual final silicon film thickness is determined by the particular device requirements of the optical device. The resultant grown silicon is depicted as region 46. As known to one skilled in the art, epitaxial growth requires careful pre-treatment to ensure that the silicon surface is clean and free of native oxide prior to growth. Such cleans may consist of a high temperature hydrogen bake. Such a heat cycle may not desirable after diffusions are formed in a transistor flow, and thus, this embodiment favorably places the epitaxial process prior to well formation in the standard electronics flow.

Shown in FIG. 5, the pad oxide 16 and remainder of nitride 18 are removed with an etching step in region 22. The nitride etch preferably includes a dry etch stopping on oxide 16 in the electronics region 22 and silicon in optics region 20.

Shown in FIG. 6, standard semiconductor processing is followed to build the devices in electronics region 22, up through gate electrode deposition. Not shown, for simplicity, are the well implants in this region, which could be masked from optics region 20. A gate dielectric 48 is grown or deposited across the entire structure and then a gate electrode material 50 is deposited on top of the gate dielectric. The gate dielectric 48 could be formed either by a first, thick gate thermal oxidation followed by a strip or patterned strip and then followed by a subsequent or multiple repetitions of gate oxidations depending upon the specific electronic or optical device needs.

Figure 7:
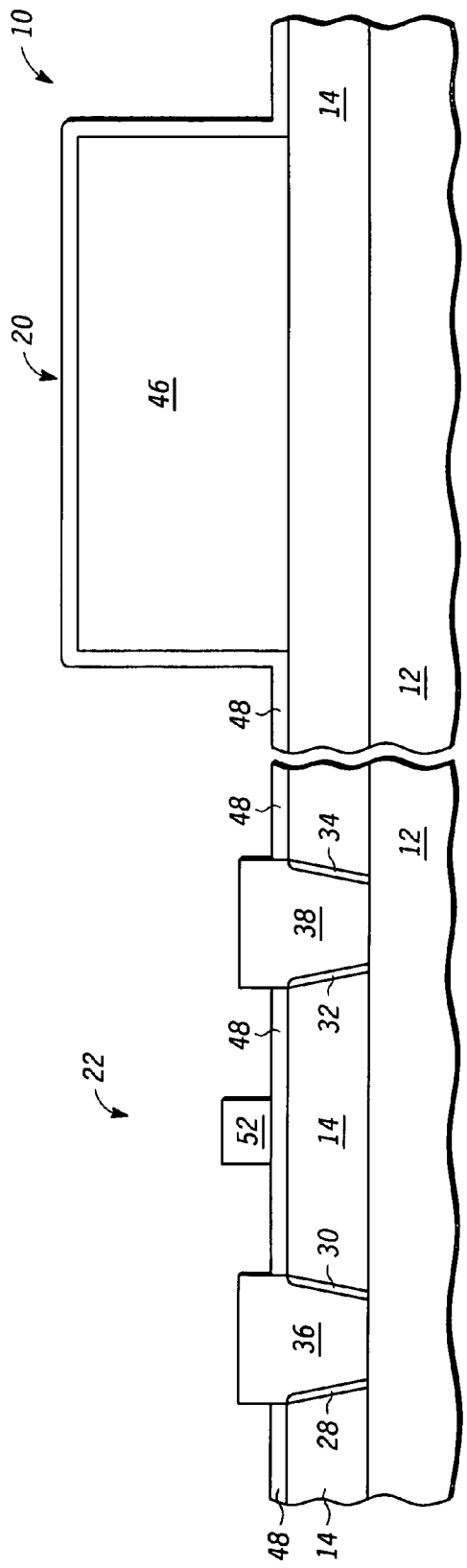
FIG. 7 is a cross section of the semiconductor device structure of FIG. 6 at a subsequent stage in processing.

Shown in FIG. 7 is the structure following the patterning and etching of the gate electrode material 50 in region 22 to form the gate electrode 52. Note that the gate electrode material is completely removed from the top of the optics region 20.

Figure 8:
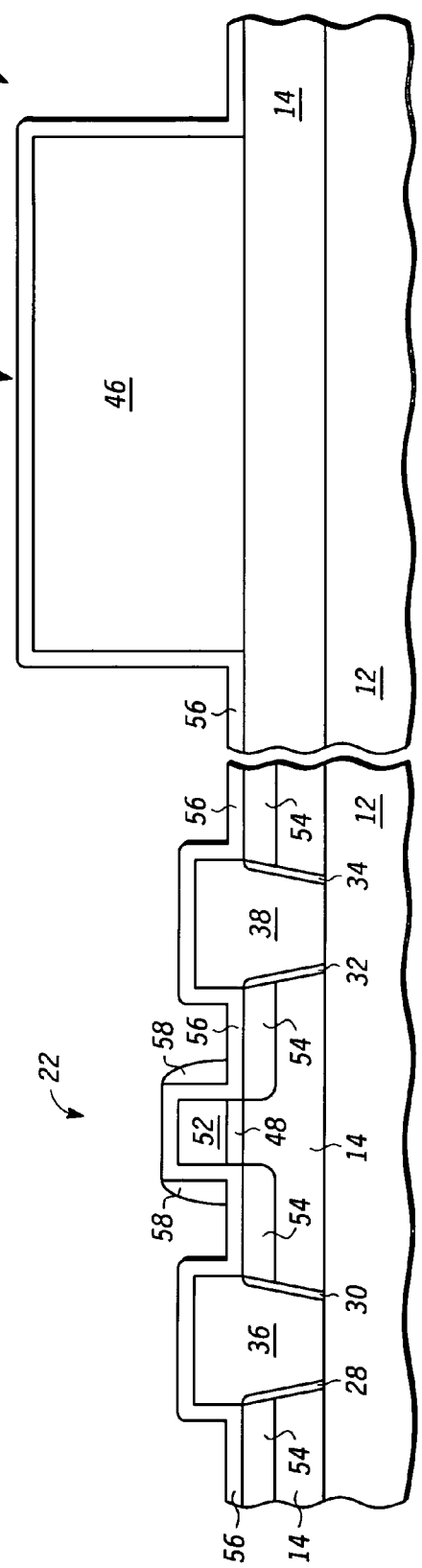
FIG. 8 is a cross section of the semiconductor device structure of FIG. 7 at a subsequent stage in processing.

Shown in FIG. 8 is the semiconductor device structure 10 through spacer formation in electronic region 22 using conventional means. The transistor comprises gate dielectric 48 over semiconductor layer 14 and etched gate electrode 52 over gate dielectric 48. Source/drain extensions 54 are formed through ion implantation. A spacer liner 56 is deposited everywhere and a sidewall spacer 58 is formed around gate 52 by etching of the spacer material 58 to stop on the spacer liner 56.

Figure 9:
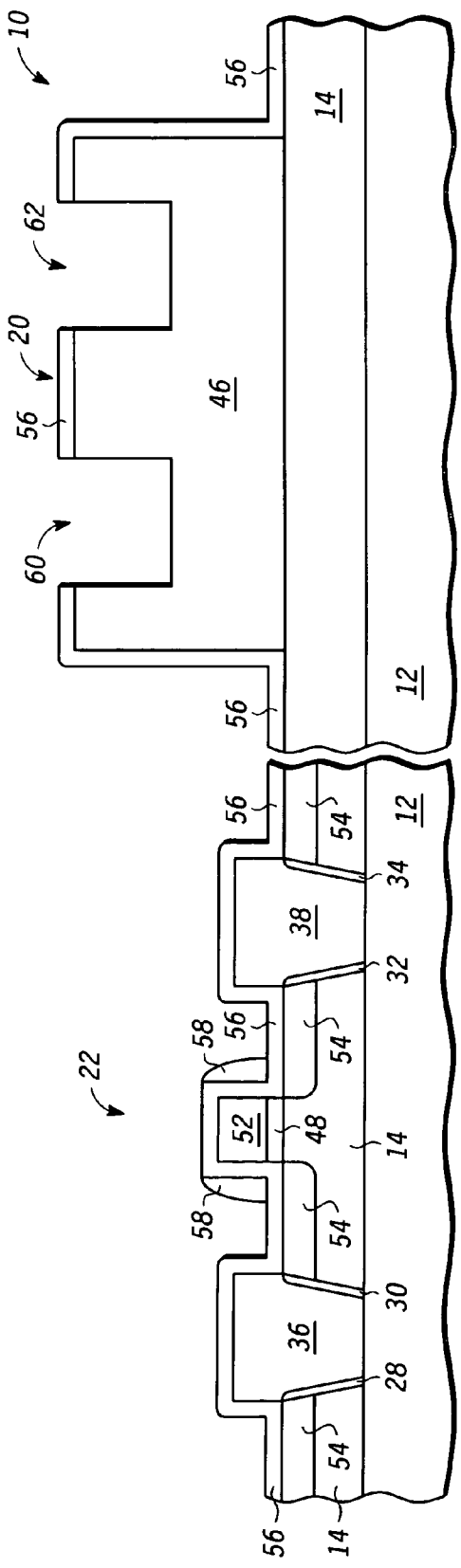
FIG. 9 is a cross section of the semiconductor device structure of FIG. 8 at a subsequent stage in processing.

Shown in FIG. 9 is semiconductor device structure 10 after formation of trenches 60 and 62 in the epitaxially grown silicon 46 within optics region 20. Using standard photolithographic techniques, regions over epitaxial silicon 46 are opened and portions of liner 56 and silicon layer 46 are subsequently etched using a conventional timed silicon etch. The etch depth can be selected according the particular optical device requirements but would, in this embodiment, be about 1500 angstroms.

Figure 10:
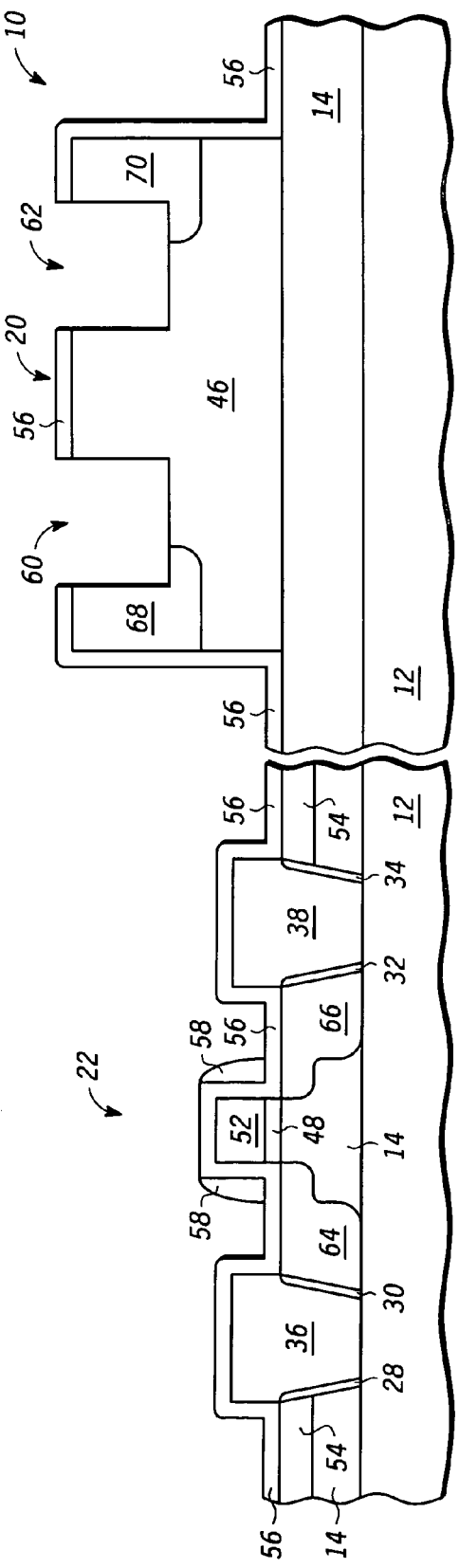
FIG. 10 is a cross section of the semiconductor device structure of FIG. 9 at a subsequent stage in processing.

Shown in FIG. 10 is semiconductor device structure 10 after formation of source/drain diffusions 64, 65, 66 and 67 in electronics region 22 and optional contact diffusions 68 and 70 in optical device region 20 and subsequent annealing. Such features can be formed by ion implantation and annealed with any thermal process with rapid thermal annealing being preferable.

Figure 11:
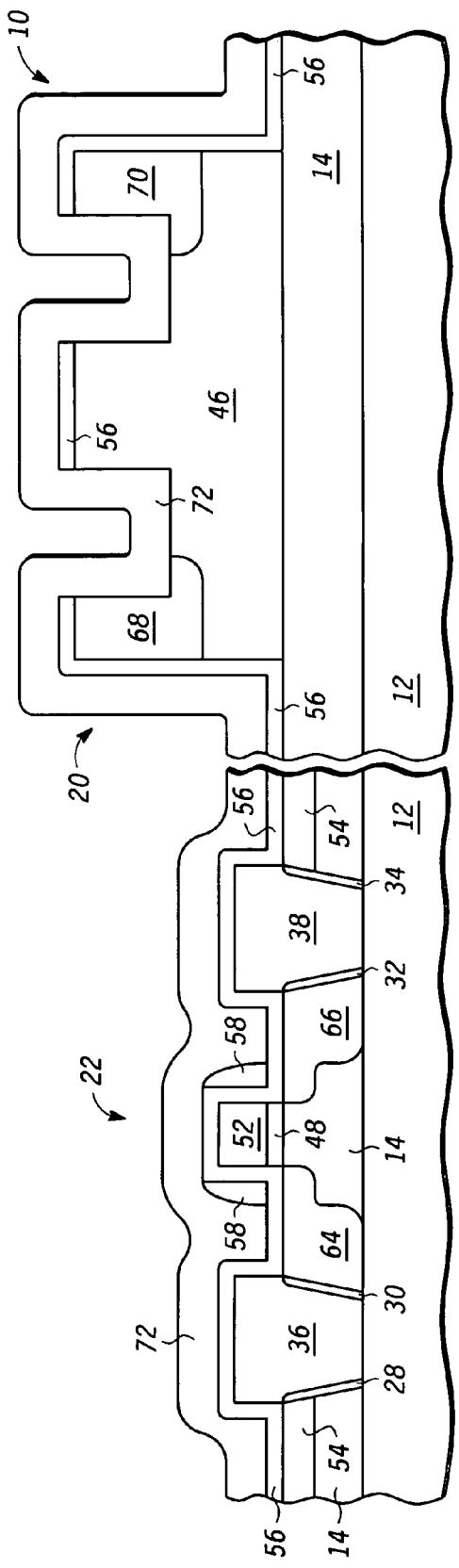
FIG. 11 is a cross section of the semiconductor device structure of FIG. 10 at a subsequent stage in processing.

Shown in FIG. 11 is semiconductor device structure 10 after deposition of a dielectric layer 72 intended as a salicide block layer.

Figure 12:
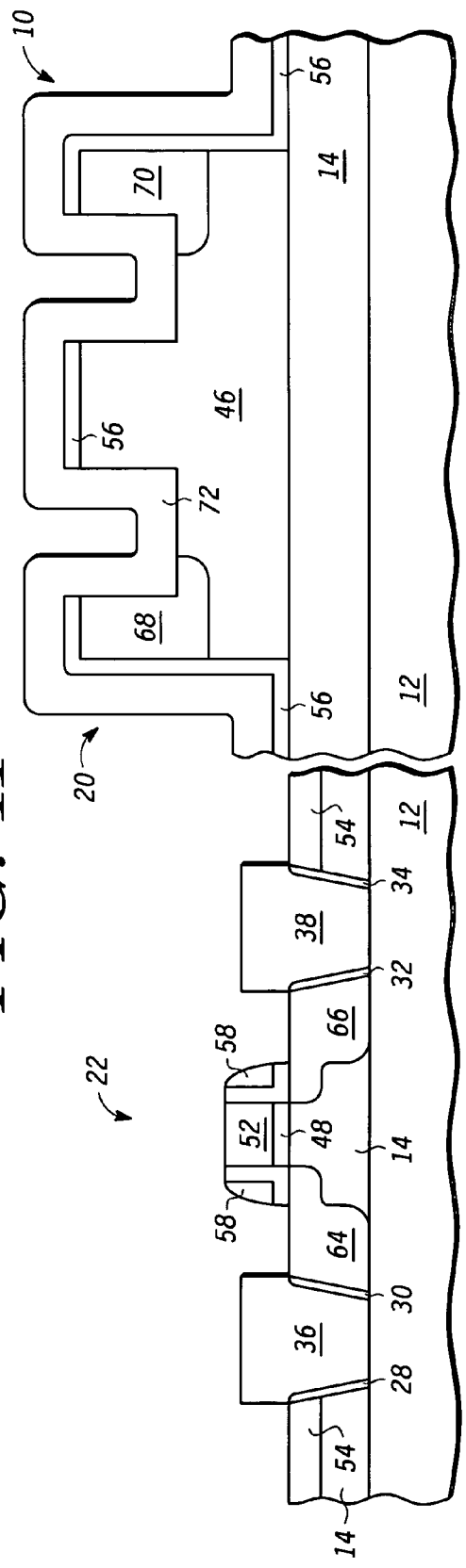
FIG. 12 is a cross section of the semiconductor device structure of FIG. 11 at a subsequent stage in processing.

Shown in FIG. 12 is semiconductor device structure 10 after selective removal of the salicide blocking film 72 and spacer liner oxide 56 over the exposed active regions 14 and gate electrode regions 52. The remainder of the film, 72 will be present over the entirety of the optical device region 20 as shown for simplicity in the accompanying figures, but may be removed in portions of the optical region 20 where contact diffusions are connected to the upper metallization (not shown in FIG. 12).

Figure 13:
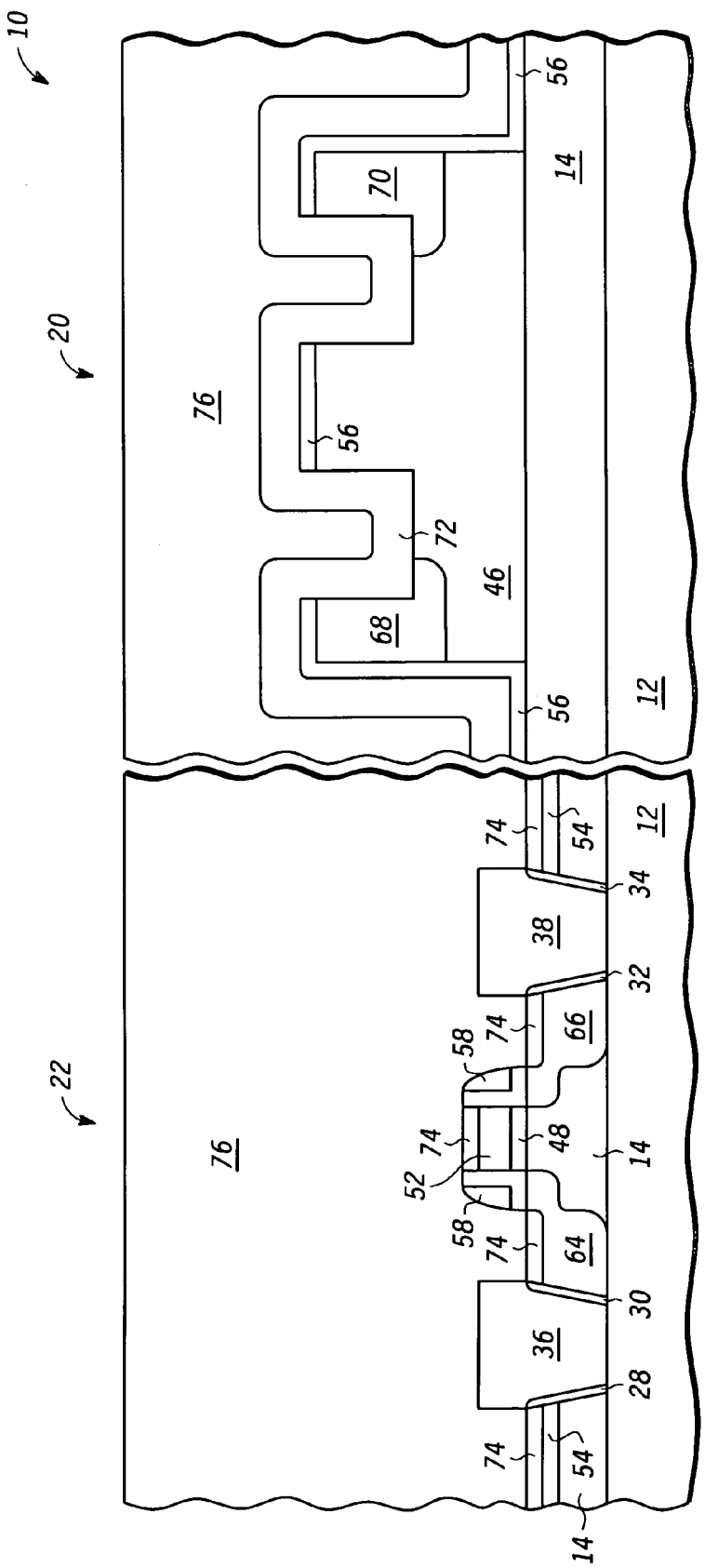
FIG. 13 is a cross section of the semiconductor device structure of FIG. 12 at a subsequent stage in processing.

Shown in FIG. 13 is semiconductor device structure 10 after the formation of a salicide 74 and subsequent interlayer dielectric deposition 76 and planarization. The salicide is formed through standard means by depositing a metal, preferably cobalt or nickel with a Ti of TiN cap, annealing to form a reaction between the metal and silicon 14 in contact with the metal and etching to remove unreacted metal. Additional heat cycles may be used in this process. Film 72 specifically prevents such a salicide from forming in the optical region where it might otherwise induce unacceptable optical losses. An interlayer dielectric film 76 or stack of films is deposited which simultaneously forms the side and upper cladding layers for optical devices in optical device portion 20. Subsequent to this step, contacts and metallizations are formed as in a conventional electronics process.

Shown in FIG. 14 is the device 10 in another embodiment of the present invention, wherein the epitaxial growth is not formed until after electronic device spacer deposition. This embodiment is motivated by the requirement of high-performance CMOS to have a planar surface prior to gate electrode patterning, thus enabling tight design rules and aggressive critical dimensions. Note, in the previous embodiment, a large exclusion region may be required between the optics and electronics portions of the chip. However, in the present embodiment, a large exclusion region is not be required. Standard electronics processing for the formation of high performance electronics is followed through spacer deposition. The electronics portion 22 is as it would be just prior to the spacer etch shown in FIG. 8. The optics portion remains as active silicon. Notably liner dielectric 56 is shown to overlay the entire structure and spacer material, preferably a nitride, 57 is shown to overly the liner dielectric 56.

Shown in FIG. 15, an opening is patterned using photolithographic and etch techniques in the liner 56 and spacer film 57 in optics region 20 of the device. The entirety of electronics portion 22 is protected from this etch by photoresist. Following the removal of layers 56 and 57, the photoresist is removed everywhere and the remainder of the layers 56 and 57 form a hardmask to define a region over the optics region 20 of the circuit for selective epitaxial growth. Approximately 2300 angstroms of silicon is grown in the opening in layers 56 and 57 to form a totality of about 3000 angstroms as region 80. The exact final thickness of the silicon 80 is determined by the specific device requirements on the optical device.

Figure 16:
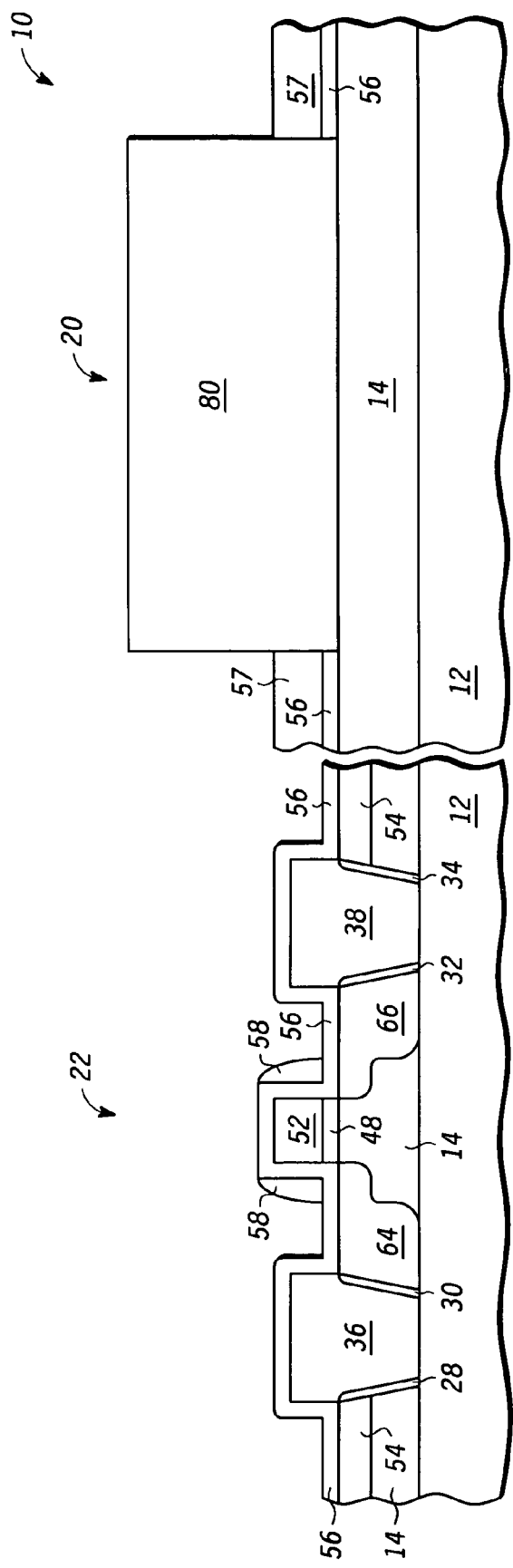
FIG. 16 is a cross section of the semiconductor device structure of FIG. 15 at a subsequent stage in processing.

Shown in FIG. 16, spacer material 57 is etched to form sidewall spacers 58 in the electronics portion of the device. This etch would be performed selectively using a photoresist mask to protect the optics portion of the device. Subsequent processing would continue as indicated on FIG. 9 with the exception that liner film 56 would not be present on the optical portion of the device and the remainder of liner and spacer material 56 and 57 would exist as the boundary of the window within which the epitaxial material (46 in embodiment 1 and 80 in embodiment 2) was grown. Likewise, the remainder of the process would follow FIGS. 10, 11, 12 and 13 with the same modifications to the drawings.

In the foregoing specification, the invention has been described with reference to specific embodiments. However, one of ordinary skill in the art appreciates that various modifications and changes can be made without departing from the scope of the present invention as set forth in the claims below. For example, the integrated device could have any of a multitude of architectures. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for integrating an optical device and an electronic device on a semiconductor substrate, comprising:
    providing a semiconductor substrate having an active semiconductor layer;
    forming openings within the active semiconductor layer in a first region of the semiconductor substrate and protecting the active semiconductor layer in a second region of the semiconductor substrate during the formation of openings within the active semiconductor layer in the first region, wherein the first region corresponds to an electronic device portion of the semiconductor substrate and the second region corresponds to an optical device portion of the semiconductor substrate;
    filling the openings of the active semiconductor layer in the electronic device portion of the semiconductor substrate with a fill material;
    exposing a portion of the active semiconductor layer in the second region of the semiconductor substrate and protecting the first region of the semiconductor substrate during the exposing of the active semiconductor layer in the second region;
    epitaxially growing a semiconductor layer overlying the exposed active semiconductor layer in the second region, the epitaxially grown semiconductor layer corresponding to an optical device region;
    forming at least a portion of an electronic device on the active semiconductor layer within the electronic device portion of the semiconductor substrate;
    forming openings within the epitaxially grown semiconductor layer of the optical device portion of the semiconductor substrate, wherein the openings define one or more features of an optical device; and
    forming a further portion of the electronic device within the electronic device portion of the semiconductor substrate.

2. The method of claim 1, wherein the active semiconductor layer and the epitaxially grown semiconductor layer have a combined total thickness sufficient to create a waveguide.

3. The method of claim 1, wherein the active semiconductor layer and the epitaxially grown semiconductor layer have a combined total thickness on the order of approximately 3,000 angstroms.

4. The method of claim 1, wherein forming the portion of the electronic device includes forming a gate dielectric and a gate electrode on the active semiconductor layer within the electronic device portion of the semiconductor substrate.

5. The method of claim 4, further wherein the gate dielectric protects the optical device region in the optical device portion of the semiconductor substrate during patterning of the gate electrode in the electronic device portion of the semiconductor substrate.

6. The method of claim 4, wherein forming the portion of the electronic device further includes forming extension implant regions within the active semiconductor layer proximate the gate electrode in the electronic device portion of the semiconductor substrate.

7. The method of claim 4, wherein forming the portion of the electronic device further includes forming a spacer liner and sidewall spacers, the spacer liner being formed on exposed portions of the active semiconductor layer and the gate electrode in the electronic device portion of the semiconductor substrate and the sidewall spacers being formed on sidewalls of the gate electrode with the spacer liner in-between the gate electrode and the sidewall spacers.

8. The method of claim 7, further wherein the spacer liner protects the optical device region in the optical device portion of the semiconductor substrate during forming of the sidewall spacers in the electronic device portion of the semiconductor substrate.

9. The method of claim 1, wherein forming the portion of the electronic device includes depositing a first dielectric layer and a second dielectric layer overlying the first and second regions of the semiconductor substrate, and patterning and etching the second dielectric layer to form sidewall spacers on sidewalls of the gate electrode with a portion of the first dielectric layer in-between the gate electrode and the sidewall spacers, further wherein the first dielectric layer protects the optical device region in the optical device portion of the semiconductor substrate during patterning and etching of the sidewall spacers in the electronic device portion of the semiconductor substrate.

10. The method of claim 1, wherein forming the openings of the active semiconductor layer in the electronic device portion of the semiconductor substrate comprises etching the openings, and wherein forming the trench liner comprises an oxidation process optimized to passivate the etched sidewalls, round corners of the openings, and to optimize a stress in the active semiconductor layer between the openings of the active semiconductor layer in the electronics device portion of the semiconductor substrate.

11. The method of claim 1, further comprising forming a trench liner on sidewalls within the openings of the active semiconductor layer in the electronic device portion of the semiconductor substrate, wherein forming the trench liner comprises an oxidation process optimized to control stresses in the active semiconductor layer between the openings.

12. The method of claim 11, wherein the trench liner comprises a thickness configured to provide an optimized high performance electronic device characteristic.

13. The method of claim 1, wherein forming the openings within the epitaxially grown semiconductor layer defines an optical waveguide within the optical device region of the optical device portion of the semiconductor substrate.

14. The method of claim 1, wherein forming the further portion of the electronic device includes forming source/drain implant regions.

15. The method of claim 14, further wherein forming the source/drain implant regions also includes forming electrical contacted regions within the epitaxially grown semiconductor layer of the optical device portion of the semiconductor substrate.

16. The method of claim 15, further comprising:
forming a salicide blocking layer overlying the optical device portion of the semiconductor substrate;
saliciding the electronic device portion of the semiconductor substrate, wherein the salicide blocking layer prevents salicidation of the epitaxially grown semiconductor within the optical device porion of the semiconductor substrate; and
forming an interlevel dielectric layer overlying the electronic device portion and the optical device portion of the semiconductor substrate,
wherein saliciding includes saliciding the electrical contacted regions within the epitaxially grown semiconductor layer.

17. The method of claim 16, wherein forming the salicide blocking layer comprises depositing TEOS on the optical device portion and the electronic device portion of the semiconductor substrate and then removing the TEOS from the electronic device portion.

18. The method of claim 16, wherein forming the salicide blocking layer comprises patterning the blocking layer to overlie the optical device portion of the semiconductor substrate alone.

19. The method of claim 16, wherein saliciding includes forming a salicidation metallization overlying the optical device portion and the electronic device portion of the semiconductor substrate, annealing the salicidation metallization to form salicided regions on exposed regions of semiconductor material within the electronic device portion of the semiconductor substrate, wherein the salicide blocking layer prevents salicidation of the salicidation metallization overlying the active semiconductor layer within the optical device portion of the semiconductor substrate.

20. The method of claim 1, wherein the fill material includes one or more of TEOS, a furnace oxide, or a high density plasma oxide.

21. The method of claim 1, wherein the optical device portion of the semiconductor substrate can comprise one or more of an optical grating coupler, a waveguide, a wavelength selective filter, an optical modulator, or an arrayed waveguide grating.

22. A method for integrating an optical device and an electronic device on a semiconductor substrate, comprising:
providing a semiconductor substrate having an active semiconductor layer;
forming openings within the active semiconductor layer in a first region of the semiconductor substrate and protecting the active semiconductor layer in a second region of the semiconductor substrate during the formation of openings within the active semiconductor layer in the first region, wherein the first region corresponds to an electronic device portion of the semiconductor substrate and the second region corresponds to an optical device portion of the semiconductor substrate;
filling the openings of the active semiconductor layer in the electronic device portion of the semiconductor substrate with a fill material;
forming at least a portion of an electronic device on the active semiconductor layer within the electronic device portion of the semiconductor substrate;
depositing a first dielectric layer and a second dielectric layer overlying the first and second regions of the semiconductor substrate;
exposing a portion of the active semiconductor layer in the second region of the semiconductor substrate and protecting the first region of the semiconductor substrate during the exposing of the active semiconductor layer in the second region;
epitaxially growing a semiconductor layer overlying the exposed active semiconductor layer in the second region, the epitaxially grown semiconductor layer corresponding to an optical device region;
patterning and etching the second dielectric layer to form sidewall spacers on sidewalls of the gate electrode with a portion of the first dielectric layer in-between the gate electrode and the sidewall spacers;
forming openings within the epitaxially grown semiconductor layer of the optical device portion of the semiconductor substrate, wherein the openings define one or more features of an optical device; and forming a further portion of the electronic device within the electronic device portion of the semiconductor substrate.

23. The method of claim 22, wherein forming the portion of the electronic device includes forming a gate dielectric and a gate electrode on the active semiconductor layer within the electronic device portion of the semiconductor substrate.

24. The method of claim 23, further wherein the gate dielectric protects the optical device region in the optical device portion of the semiconductor substrate during patterning of the gate electrode in the electronic device portion of the semiconductor substrate.

25. The method of claim 23, wherein forming the portion of the electronic device further includes forming extension implant regions within the active semiconductor layer proximate the gate electrode in the electronic device portion of the semiconductor substrate.

26. The method of claim 22, wherein the active semiconductor layer and the epitaxially grown semiconductor layer have a combined total thickness sufficient to create a waveguide.

27. The method of claim 22, wherein the active semiconductor layer and the epitaxially grown semiconductor layer have a combined total thickness on the order of approximately 3,000 angstroms.

28. The method of claim 22, wherein patterning and etching the second dielectric layer includes protecting the second region of the semiconductor substrate.

29. The method of claim 22, wherein forming the openings defines an optical waveguide within the optical device region of the optical device portion of the semiconductor substrate.

30. The method of claim 22, wherein forming the further portion of the electronic device includes forming source/drain implant regions.

31. The method of claim 30, further wherein forming the source/drain implant regions also includes forming electrical contacted regions within the epitaxially grown semiconductor layer proximate the optical waveguide within the optical device region of the optical device portion of the semiconductor substrate.

32. The method of claim 31, further comprising:
forming a salicide blocking layer overlying the optical device portion of the semiconductor substrate;
saliciding the electronic device portion of the semiconductor substrate, wherein the salicide blocking layer prevents salicidation of the epitaxially grown semiconductor within the optical device porion of the semiconductor substrate; and
forming an interlevel dielectric layer overlying the electronic device portion and the optical device portion of the semiconductor substrate,
wherein saliciding further includes saliciding the electrical contacted regions within the epitaxially grown semiconductor layer.

33. The method of claim 32, wherein forming the salicide blocking layer comprises depositing TEOS on the optical device portion and the electronic device portion of the semiconductor substrate and then removing the TEOS from the electronic device portion.

34. The method of claim 32, wherein forming the salicide blocking layer comprises patterning the blocking layer to overlie the optical device portion of the semiconductor substrate alone.

35. The method of claim 32, wherein saliciding includes forming a salicidation metallization overlying the optical device portion and the electronic device portion of the semiconductor substrate, annealing the salicidation metallization to form salicided regions on exposed regions of semiconductor material within the electronic device portion of the semiconductor substrate, wherein the salicide blocking layer prevents salicidation of the salicidation metallization overlying the active semiconductor layer within the optical device portion of the semiconductor substrate.

36. The method of claim 22, wherein the fill material includes one or more of TEOS, a furnace oxide, or a high density plasma oxide.

37. The method of claim 22, wherein the optical device portion of the semiconductor substrate can comprise one or more of an optical grating coupler, a waveguide, a wavelength selective filter, an optical modulator, or an arrayed waveguide grating.

* * * * *